United States Patent
Ikeuchi et al.

(10) Patent No.: US 8,642,486 B2
(45) Date of Patent: Feb. 4, 2014

(54) THIN FILM FORMING METHOD, THIN FILM FORMING APPARATUS, AND PROGRAM

(75) Inventors: Toshiyuki Ikeuchi, Nirasaki (JP); Pao-Hwa Chou, Nirasaki (JP); Kazuya Yamamoto, Nirasaki (JP); Kentarou Sera, Nirasaki (JP)

(73) Assignee: Tokyo Electron Limited (JP)

( * ) Notice: Subject to any disclaimer, the term of this patent is extended or adjusted under 35 U.S.C. 154(b) by 29 days.

(21) Appl. No.: 13/337,743

(22) Filed: Dec. 27, 2011

(65) Prior Publication Data
US 2012/0164847 A1 Jun. 28, 2012

(30) Foreign Application Priority Data
Dec. 28, 2010 (JP) ................................. 2010-293816

(51) Int. Cl.
*H01L 21/31* (2006.01)
(52) U.S. Cl.
USPC ............... 438/770; 438/787; 257/E21.282
(58) Field of Classification Search
None
See application file for complete search history.

(56) References Cited

U.S. PATENT DOCUMENTS

| 2008/0132083 A1* | 6/2008 | Matsuura ................. 438/770 |
| 2009/0203227 A1* | 8/2009 | Hasebe et al. ............ 438/787 |
| 2010/0130015 A1* | 5/2010 | Nakajima et al. ......... 438/703 |

FOREIGN PATENT DOCUMENTS

JP 2004-281853 10/2004

* cited by examiner

*Primary Examiner* — Zandra Smith
*Assistant Examiner* — Pamela E Perkins
(74) *Attorney, Agent, or Firm* — Cantor Colburn LLP (57) ABSTRACT

A control unit heats a reaction pipe to a load temperature by controlling a temperature-raising heater 16, and then makes semiconductor wafers received in the reaction pipe. Next, the control unit heats the reaction pipe in which the semiconductor wafers are received to a film formation temperature by controlling the temperature-raising heater, and then forms thin films on the semiconductor wafers by supplying a film forming gas into the reaction pipe from a process gas introducing pipe. Also, the control unit sets the load temperature to a temperature higher than the film formation temperature.

5 Claims, 5 Drawing Sheets

FIG. 1

CONTROL UNIT

THIN FILM FORMING METHOD, THIN FILM FORMING APPARATUS, AND PROGRAM

CROSS-REFERENCE TO RELATED PATENT APPLICATIONS

This application claims the benefit of Japanese Patent Application No. 2010-293816, filed on Dec. 28, 2010, in the Japan Patent Office, the disclosure of which is incorporated herein in its entirety by reference.

BACKGROUND OF THE INVENTION

1. Field of the Invention

The present invention relates to a thin film forming method, a thin film forming apparatus, and a program.

2. Description of the Related Art

Recently, when a thin film is formed on an object, for example, a semiconductor wafer, the semiconductor wafer is required to be processed at a low temperature, and a method of forming a thin film by using, for example, atomic layer deposition (ALD), is examined.

Various methods are suggested as such a method of forming a thin film by using ALD, and a method of forming a thin film at a low temperature of about 300° C. to 600° C. by using an organic silicon (Si) source is disclosed in, for example, Patent Document 1.

However, in a method of forming a silicon oxide film by using, for example, ALD, in order to make a film formation temperature a low temperature, a material, which becomes more adsorptive as a temperature becomes lower, may be used as an organic Si source. However, when such an organic Si source is used, a film formation rate at a low-temperature portion around an opening (a furnace opening) of a processing chamber in which semiconductor wafers are received is increased, thereby degrading film thickness uniformity in an inter-surface direction of a thin film.

3. Prior Art Reference

[Patent Document 1] Japanese Laid-Open Patent Publication No. 2004-281853

SUMMARY OF THE INVENTION

Considering the above and other problems, an objective of the present invention is to provide a thin film forming method, a thin film forming apparatus, and a program which may form a thin film having excellent film thickness uniformity in an inter-surface direction at a low temperature.

According to an aspect of the present invention, there is provided a thin film forming method including: loading an object in a reaction chamber which is heated to a load temperature; and heating the reaction chamber, in which the object is loaded, to a film formation temperature, and then forming a thin film on the object by supplying a film forming gas into the reaction chamber, wherein, in the loading of the object in the reaction chamber, the load temperature is set to a temperature higher than the film formation temperature.

According to another aspect of the present invention, there is provided a thin film forming apparatus including: a reaction chamber in which an object is received; a heating unit which heats the reaction chamber to a predetermined temperature; a film forming gas supply unit which supplies a film forming gas into the reaction chamber; and a control unit which controls each portion of the film forming apparatus, wherein the control unit heats the reaction chamber to a load temperature by controlling the heating unit, and then makes the object received in the reaction chamber, heats the reaction chamber to a film formation temperature by controlling the heating unit, and then forms a thin film on the object by supplying a film forming gas into the reaction chamber by controlling the film forming gas supply unit, and sets the load temperature to a temperature higher than the film formation temperature.

According to another aspect of the present invention, there is provided a program for enabling a computer to serve as a heating unit which heats a reaction chamber, in which an object is received, to a predetermined temperature; a film forming gas supply unit which supplies a film forming gas into the reaction chamber; and a film forming unit which heats the reaction chamber to a load temperature by controlling the heating unit and then makes the object received in the reaction chamber, heats the reaction chamber to a film formation temperature by controlling the heating unit and then forms a thin film on the object by supplying a film forming gas into the reaction chamber by controlling the film forming gas supply unit, and sets the load temperature to a temperature higher than the film formation temperature.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Hereinafter, a thin film forming method, a thin film forming apparatus, and a program of the present invention will be explained. In the present embodiment, a case where silicon oxide films are formed on a semiconductor wafers by using a batch-type vertical heat treatment apparatus shown in FIG. 1 as a thin film forming apparatus of the present invention will be explained.

Figure 1:
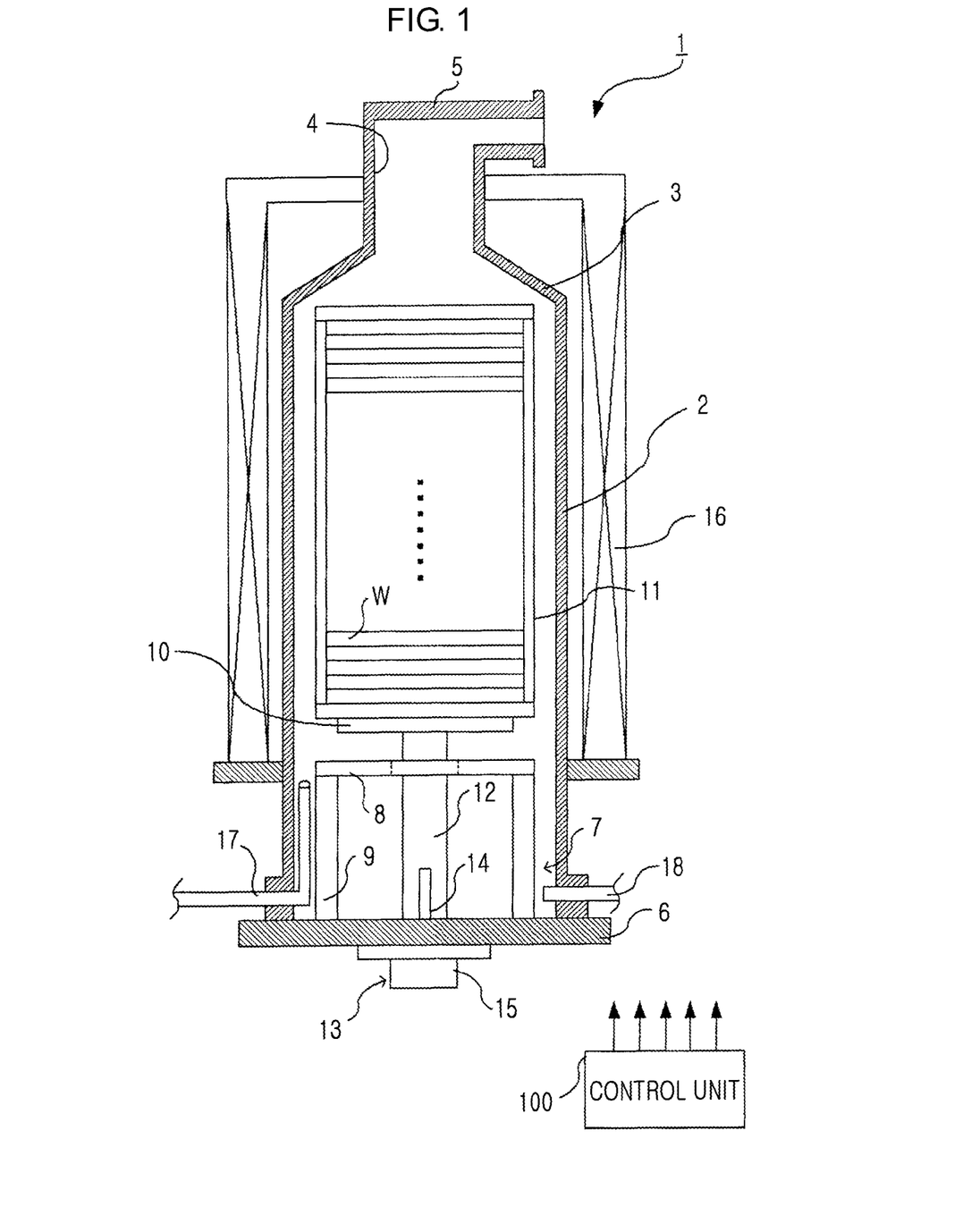
FIG. 1 is a view showing a heat treatment apparatus according to an embodiment of the present invention.

As shown in FIG. 1, a heat treatment apparatus 1 includes a reaction pipe 2 which forms a reaction chamber. The reaction pipe 2 is formed, for example, to have a substantially cylindrical shape whose longitudinal direction is a vertical direction. The reaction pipe 2 is formed of a material having high heat resistance and high corrosion resistance, for example, quartz.

A top portion 3 having a substantially conical shape is provided at a top end of the reaction pipe 2 to decrease the radius toward the top end. An exhaust port 4 through which a gas in the reaction pipe 2 is exhausted is provided at a center of the top portion 3, and an exhaust pipe 5 is airtightly connected to the exhaust port 4. A pressure adjustment mechanism such as a valve (not shown) and a vacuum pump 127 which will be explained below are provided on the exhaust pipe 5, so that a pressure in the reaction pipe 2 is controlled to be a desired pressure (vacuum level).

A lid 6 is disposed under the reaction pipe 2. The lid 6 is formed of a material having high heat resistance and high corrosion resistance, for example, quartz. Also, the lid 6 is configured to be vertically movable by a boat elevator 128 which will be explained below. When the lid 6 is raised by the boat elevator 128, a lower portion (a furnace opening portion) of the reaction pipe 2 is closed, and when the lid 6 is lowered by the boat elevator 128, the lower portion (the furnace opening portion) of the reaction pipe 2 is opened.

A thermo-container 7 is provided on the lid 6. The thermo-container 7 mainly includes a heater 8 which has a planar shape and is formed of a resistance heating material for preventing a temperature in the reaction pipe 2 from being reduced due to heat dissipation from the furnace opening portion of the reaction pipe 2, and a support 9 which has a container shape and supports the heater 8 at a predetermined height from a top surface of the lid 6.

Also, a rotary table 10 is provided over the thermo-container 7. The rotary table 10 serves as a holding stage on which a wafer boat 11 in which objects, for example, semiconductor wafers W, are received is rotatably held. In detail, a rotary strut 12 is provided under the rotary table 10, and passes through a central portion of the heater 8 to be connected to a rotation mechanism 13 for rotating the rotary table 10. The rotation mechanism 13 mainly includes a motor (not shown) and a rotational force introducing unit 15 which includes a rotational shaft 14 airtightly passing through the lid 6 from a bottom surface to the top surface of the lid 6. The rotational shaft 14 is connected to the rotary strut 12 of the rotary table 10, and transmits a rotational force of the motor to the rotary table 10 through the rotary strut 12. Accordingly, when the rotational shaft 14 is rotated by the motor of the rotation mechanism 13, a rotational force of the rotational shaft 14 is transmitted to the rotary strut 12 to rotate the rotary table 10.

The wafer boat 11 is held on the rotary table 10. The wafer boat 11 is configured such that a plurality of the semiconductor wafers W are vertically arranged at predetermined intervals in the wafer boat 11. Accordingly, when the rotary table 10 is rotated, the wafer boat 11 is rotated, and thus the semiconductor wafers W received in the wafer boat 11 are rotated. The wafer boat 11 is formed of a material having high heat resistance and high corrosion resistance, for example, quartz.

Also, a temperature-raising heater 16 formed of, for example, a resistance heating material, is provided around the reaction pipe 2 to surround the reaction pipe 2. A temperature in the reaction pipe 2 is increased to a predetermined temperature by the temperature-raising heater 16, and thus the semiconductor wafers W are heated to the predetermined temperature.

A plurality of process gas introducing pipes 17 are inserted into (that is, connected to) a side wall around a lower end of the reaction pipe 2. In FIG. 1, only one process gas introducing pipe 17 is shown. Process gas supply sources (not shown) are connected to the process gas introducing pipes 17, and thus desired amounts of process gases are supplied into the reaction pipe 2 through the process gas introducing pipes 17 from the process gas supply sources. A silicon (Si) source gas (e.g., an organic Si source gas), an oxidizing gas, or the like may be used as the process gases.

The organic Si source gas is a gas for adsorbing a source (e.g., Si) to the object, and is used in an adsorbing step which will be explained below. An aminosilane gas such as diisopropylaminosilane (DIPAS), tridimethylaminosilane (TDMAS), bistertiarybutylaminosilane (BTBAS), bisdimethylaminosilane (BDMAS), bisdiethylaminosilane (BDEAS), dimethylaminosilane (DMAS), diethylaminosilane (DEAS), dipropylaminosilane (DPAS), and butylaminosilane (BAS) may be used as the organic Si source gas.

The oxidizing gas is a gas for oxidizing the adsorbed source (Si), and is used in an oxidizing step which will be explained below. Oxygen ($O_2$), ozone ($O_3$), or vapor is used as the oxidizing gas. Also, if ozone is used as the oxidizing gas, an ozone generating apparatus for generating ozone, for example, by using oxygen as radicals, is connected to the process gas introducing pipe 17 for supplying ozone, and ozone generated by the ozone generating apparatus is supplied into the reaction pipe 2 through the process gas introducing pipe 17.

A purge gas supply pipe 18 is inserted into a side surface around the lower end of the reaction pipe 2. A purge gas supply source (not shown) is connected to the purge gas supply pipe 18, and a desired amount of purge gas, for example, nitrogen ($N_2$), is supplied into the reaction pipe 2 through the purge gas supply pipe 18 from the purge gas supply source.

Figure 2:
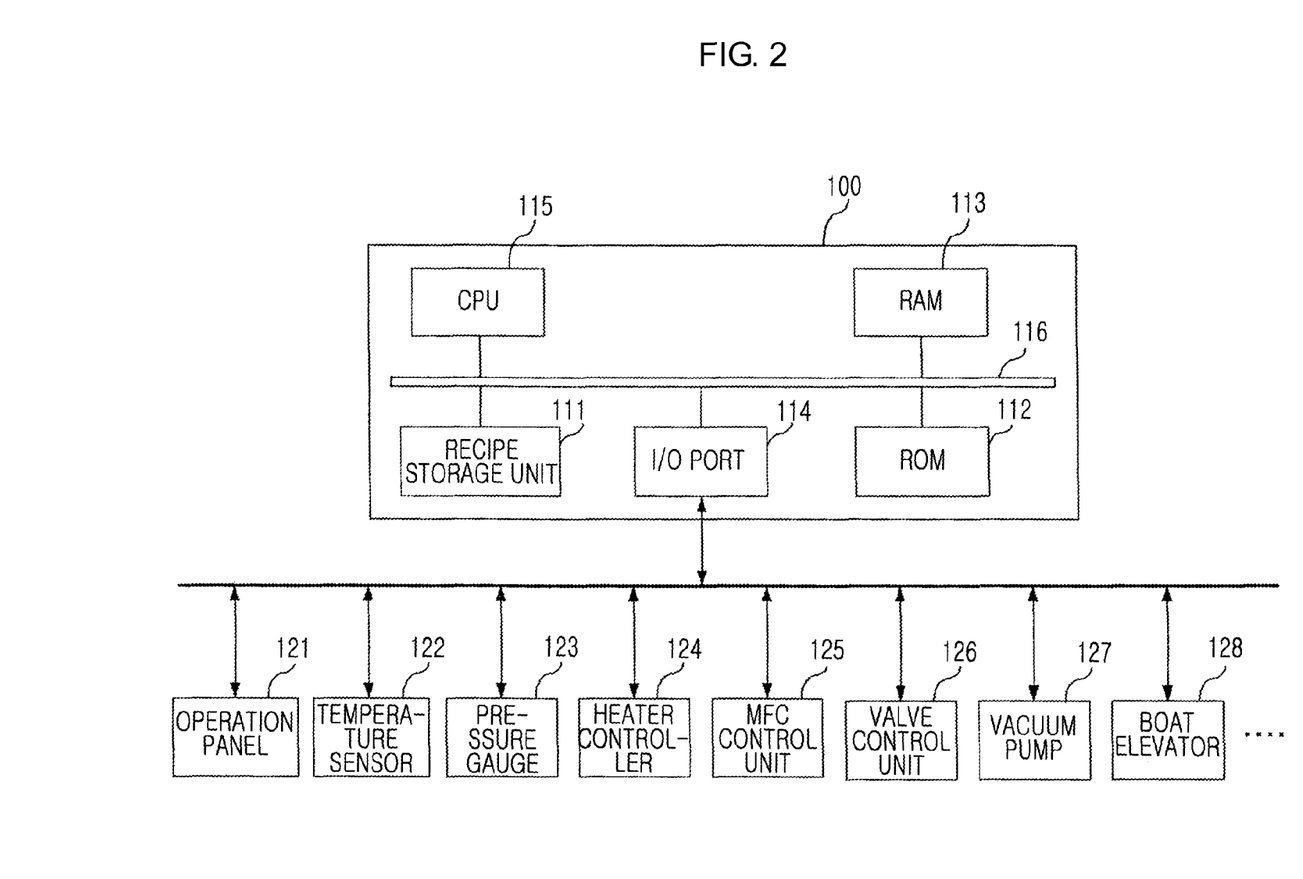
FIG. 2 is a diagram showing a configuration of a control unit of FIG. 1.

Also, the heat treatment apparatus 1 includes a control unit 100 for controlling each portion of the heat treatment apparatus 1. FIG. 2 shows a configuration of the control unit 100. As shown in FIG. 2, an operation panel 121, temperature sensors (group) 122, pressure gauges (group) 123, a heater controller 124, a mass flow controller (MFC) control unit 125, a valve control unit 126, a vacuum pump 127, and the boat elevator 128 are connected to the control unit 100.

The operation panel 121 includes a display screen and an operation button, transmits an instruction of an operator to the control unit 100, and displays various pieces of information from the control unit 100 on the display screen.

The temperature sensors (group) 122 measure a temperature of a thermocouple (T/C) provided in each zone in the reaction pipe 2, a temperature of a T/C in each zone of the temperature-raising heater 16, and a temperature in the exhaust pipe 5, and the like, and notifies the measured temperatures to the control unit 100.

The pressure gauges (group) 123 measure a pressure of each portion in the reaction pipe 2 and in the exhaust pipe, and notifies the measured pressures to the control unit 100.

The heater controller 124 for individually controlling the heater 8 and the temperature-raising heater 16 responds to an instruction from the control unit 100, heats the heater 8 and the temperature-raising heater 16 by supplying electric current to the heater 8 and the temperature-raising heater 16, individually measures power consumptions of the heater 8 and the temperature-raising heater 16, and notifies the measured power consumptions to the control unit 100.

The MFC control unit 125 controls MFCs (not shown) provided in the process gas introducing pipes 17 and the purge gas supply pipe 18 so as for flow rates of gases in the process gas introducing pipes 17 and the purge gas supply pipe 18 to be the same as flow rates instructed from the control unit 100, measures actual flow rates of the gases, and notifies the actual flow rates to the control unit 100.

The valve control unit 126 controls an opening degree of a valve disposed in each pipe to be the same as a degree instructed from the control unit 100. The vacuum pump 127 is connected to the exhaust pipe 5, and exhausts a gas in the reaction pipe 2.

The boat elevator 128 loads the wafer boat 11 (the semiconductor wafers W) held on the rotary table 10 in the reaction pipe 2 by raising the lid 6, and unloads the wafer boat 11 (the semiconductor wafers W) held on the rotary table 10 from the reaction pipe 2 by lowering the lid 6.

The control unit 100 includes a recipe storage unit 111, a read-only memory (ROM) 112, a random access memory (RAM) 113, an input/output (I/O) port 114, a central processing unit (CPU) 115, and a bus 116 which connects all of the recipe storage unit 111, the ROM 112, the RAM 113, the I/O port 114, the CPU 115 to one another.

A set-up recipe and a plurality of process recipes are stored in the recipe storage unit 111. Only the set-up recipe is stored when the heat treatment apparatus 1 is manufactured. The set-up recipe is executed when a thermal model or the like is generated according to each heat treatment apparatus. Each of the process recipes is a recipe prepared for every heat treatment (process) which a user actually performs. For example, each process recipe describes a change in a temperature of each portion, a change in a pressure in the reaction pipe 2, a time when a process gas starts to be supplied, a time when the process gas stops being supplied, an amount of the process gas which is supplied, and so on, from when the semiconductor wafers W are loaded in the reaction pipe 2 to when the semiconductor wafers W having been processed are unloaded from the reaction pipe 2.

Examples of the ROM 112 include an electrically erasable programmable read-only memory (EEPROM), a flash memory, and a hard disc, and the ROM 112 is a recording medium for storing an operation program or the like for the CPU 115.

The RAM 113 serves as a work area or the like for the CPU 115.

The I/O port 114 is connected to the operation panel 121, the temperature sensors 122, the pressure gauges 123, the heater controller 124, the MFC control unit 125, the valve control unit 126, the vacuum pump 127, the boat elevator 128, and so on, and controls data or a signal to be input/output.

The CPU 115 which is an important element of the control unit 100 executes a control program stored in the ROM 112 and controls an operation of the heat treatment apparatus 1 according to a recipe (process recipe) stored in the recipe storage unit 111 and an instruction from the operation panel 121. That is, the CPU 115 controls the temperature sensors (group) 122, the pressure gauges (group) 123, and the MFC control unit 125 to measure a temperature, a pressure, a flow rate, and so on of each portion in the reaction pipe 2, in the process gas introducing pipes 17, and in the exhaust pipe 5, outputs a control signal to the heater controller 124, the MFC control unit 125, the valve control unit 126, the vacuum pump 127, and so on based on the measured data, and controls each portion to follow the process recipe.

The bus 116 transmits information between the portions.

Next, a method of forming a silicon oxide film by using the heat treatment apparatus 1 configured as described above will be explained with reference to a recipe (a time sequence) shown in FIGS. 3A through 3E. In the present embodiment, as shown in FIGS. 3A through 3E, the method includes an adsorbing step of adsorbing Si to surfaces of the semiconductor wafers W and an oxidizing step of oxidizing the adsorbed Si. When the adsorbing step and the oxidizing step constitute one cycle, desired silicon oxide films are formed on the semiconductor wafers W by repeatedly performing the cycle a plurality of times, for example, 100 times. Also, as shown in FIGS. 3A through 3E, in the present embodiment, a case where DIPAS is used as an organic Si source gas, ozone is used as an oxidizing gas, and nitrogen is used as a diluent gas will be exemplarily explained.

Figure 3:
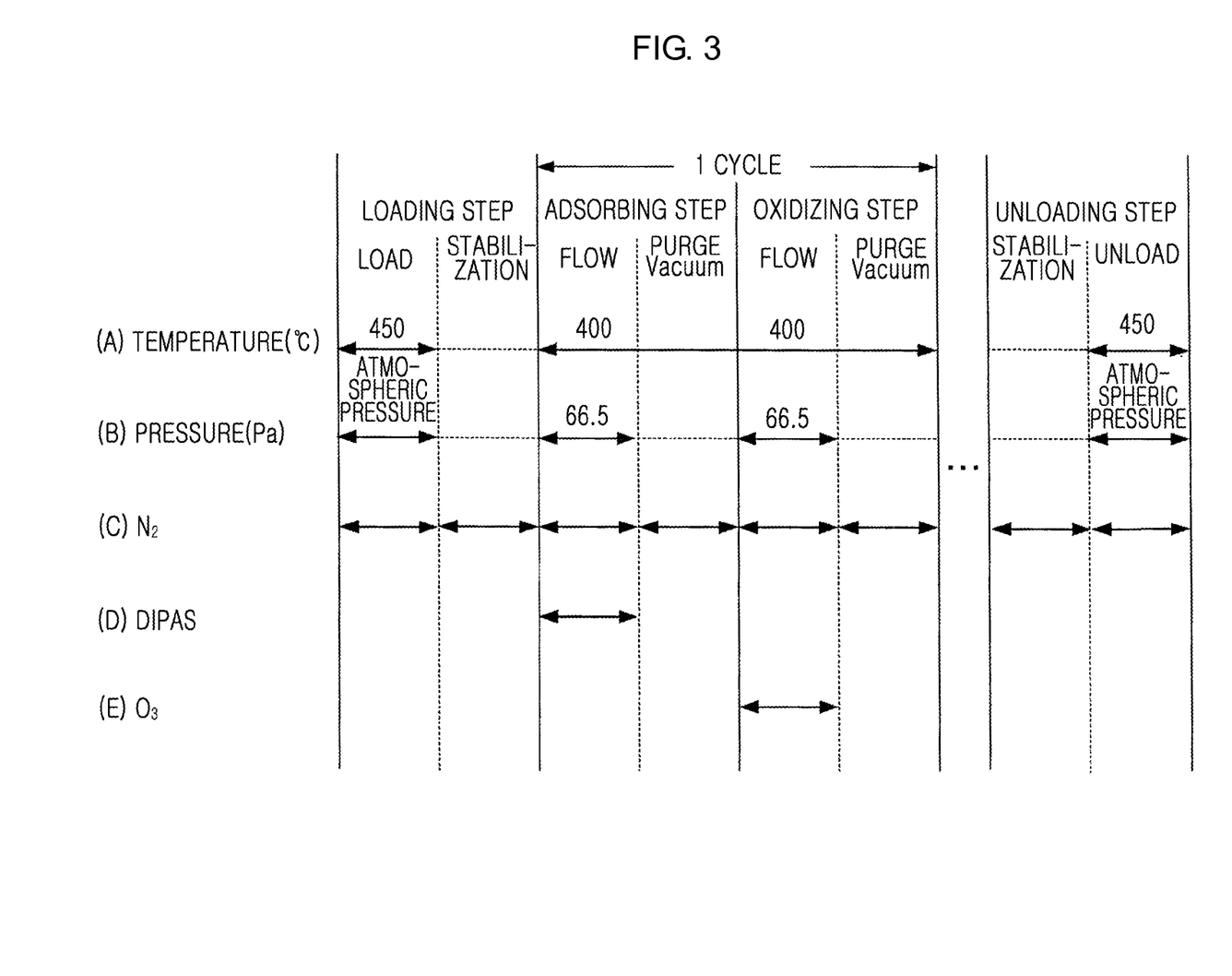
FIGS. 3A through 3E are diagrams for explaining a method of forming a silicon oxide film.

First, a loading step of receiving (loading) the semiconductor wafers W as an object in the reaction pipe 2 is performed. In detail, when the lid 6 is lowered by the boat elevator 128, as shown in FIG. 3C, a predetermined amount of nitrogen is supplied into the reaction pipe 2 from the purge gas supply pipe 18 and a temperature in the reaction pipe 2 is set to a predetermined load temperature by the temperature-raising heater 16.

Here, the load temperature is set to a temperature higher than a film formation temperature which will be explained below. The load temperature may be set to a temperature higher by 20° C. to 80° C. than the film formation temperature. If the load temperature is not higher by 20° C. or more than the film formation temperature in a vertical furnace which loads the semiconductor wafers W from downside, a temperature in the reaction pipe 2 may be unstable at a place, e.g., a lower portion in the reaction pipe 2, a temperature of the place being easily unstable. In detail, while the semiconductor wafers W earlier introduced into the reaction pipe 2 and received in an upper portion (e.g., a top portion) of the boat elevator 128 are easily warmed, temperatures of the semiconductor wafers W later introduced into the reaction pipe 2 and received in a lower portion (a BTM portion) of the boat elevator 128 are difficult to be increased. Meanwhile, if the load temperature is higher by 80° C. or more than the film formation temperature, temperature hunting occurs. Although a temperature is stabilized after a sufficient amount of time passes, throughput may be reduced, thereby failing to achieve practical productivity. If the load temperature is previously set to a temperature higher than the film formation temperature, since temperatures of the semiconductor wafers W received in the BTM portion are prevented from being reduced and temperature stabilization is rapidly achieved, temperatures of the semiconductor wafers W are easily uniform. It is more preferable that the load temperature is set to a temperature higher by 30° C. to 70° C. than the film formation temperature, and it is most preferable that the load temperature is set to a temperature higher by 40° C. to 60° C. than the film formation temperature. In the present embodiment, as shown in FIG. 3A, the load temperature is set to 450° C. which is higher by 50° C. than the film formation temperature of 400° C.

Next, the wafer boat 11 in which the semiconductor wafers W for forming a silicon oxide film are received is held on the lid 6. The semiconductor wafers W (the wafer boat 11) are loaded in the reaction pipe 2 by raising the lid 6 by using the boat elevator 128 (a loading process).

After the loading process is completed, the reaction pipe 2 is depressurized to a predetermined base pressure, for example, 0.266 Pa to 0.4 Pa (2 to $3\times10^{-3}$ Torr), by discharging a gas in the reaction pipe 2. In the present embodiment, the reaction pipe 2 is depressurized to 0.4 Pa ($3\times10^{-3}$ Torr). Next, a pressure in the reaction pipe 2 is set to 13.3 to 665 Pa (0.1 to 5 Torr), for example, to 66.5 Pa (0.5 Torr), as shown in FIG. 3B, by supplying a predetermined amount of nitrogen as shown in FIG. 3C into the reaction pipe 2 from the purge gas supply pipe 18, and a temperature in the reaction pipe 2 is set to a predetermined film formation temperature, for example, 400° C., as shown in FIG. 3A, by using the temperature-raising heater 16 (a stabilizing process).

When the temperature in the reaction pipe 2 is set to the film formation temperature due to the stabilization process, the reaction pipe 2 is cooled from the load temperature higher than the film formation temperature to the film formation temperature. As such, since the reaction pipe 2 is heated to the load temperature in the loading process in which the reaction pipe 2 is opened, and then the reaction pipe 2 is cooled to the film formation temperature in the stabilizing process in which the reaction pipe 2 is closed, the temperature in the reaction pipe 2 is easily maintained at the film formation temperature. In particular, even at the lower portion (the BTM portion) in the reaction pipe 2 where a temperature is easily reduced, the temperature in the reaction pipe 2 may be stably maintained at the same film formation temperature as at other portions.

When the reaction pipe 2 is stabilized to the film formation temperature and the pressure, an adsorbing step of adsorbing Si to surfaces of the semiconductor wafers W is performed. The adsorbing step is a process of adsorbing Si to the surfaces by supplying an organic Si source gas to the semiconductor wafers W.

In the adsorbing step, a predetermined amount of nitrogen is supplied as shown in FIG. 3C into the reaction pipe 2 from the purge gas supply pipe 18, and a predetermined amount of DIPAS is supplied as a Si source as shown in FIG. 3D into the reaction pipe 2 from the process gas introducing pipe 17 (a flow process).

The Si source supplied into the reaction pipe 2 is heated in the reaction pipe 2 and is activated. Accordingly, when the Si source is supplied into the reaction pipe 2, the surface of each semiconductor wafer W and the activated Si react with each other, and thus Si is adsorbed to the surface of each semiconductor wafer W.

When a predetermined amount of Si is adsorbed to the surfaces of the semiconductor wafers W, the DIPAS is no longer supplied from the process gas introducing pipe 17 and the nitrogen is no longer supplied from the purge gas supply pipe 18. A gas in the reaction pipe 2 is discharged, and as shown in FIG. 3C, a gas in the reaction pipe 2 is discharged to the outside of the reaction pipe 2 by supplying a predetermined amount of nitrogen into the reaction pipe 2 from the purge gas supply pipe 18 (a purge, vacuum process).

Next, an oxidizing step of oxidizing the surfaces of the semiconductor wafers W is performed. The oxidizing step is a process of oxidizing the adsorbed Si by supplying an oxidizing gas to the semiconductor wafers W including the adsorbed Si. In the present embodiment, the adsorbed Si is oxidized by supplying ozone to the semiconductor wafers W.

In the oxidizing step, a temperature in the reaction pipe 2 is set to a predetermined film formation temperature, for example, 400° C., as shown in FIG. 3A, by using the temperature-raising heater 16. Also, a predetermined amount of nitrogen is supplied as shown in FIG. 3C into the reaction pipe 2 from the purge gas supply pipe 18, and a gas in the reaction pipe 2 is discharged, thereby setting a pressure in the reaction pipe 2 to a predetermined pressure, for example, 66.5 Pa (0.5 Torr), as shown in FIG. 3B. A predetermined amount of oxidizing gas, for example, ozone, as shown in FIG. 3E, is supplied into the reaction pipe 2 from the process gas introducing pipe 17. Also, a predetermined amount of nitrogen is supplied as a diluent gas into the reaction pipe 2 from the purge gas supply pipe 18 as shown in FIG. 3C (a flow process).

Here, since the reaction pipe 2 is heated to the film formation temperature, the ozone supplied into the reaction pipe 2 is maintained in an activated state without losing its activated state in the reaction pipe 2. When the activated ozone is supplied into the reaction pipe 2, the Si adsorbed to the semiconductor wafers W is oxidized, and silicon oxide films are formed on semiconductor wafers W.

When desired silicon oxide films are formed on semiconductor wafers W, the ozone is no longer supplied from the process gas introducing pipe 17. Also, the nitrogen is no longer supplied from the purge gas supply pipe 18. A gas in the reaction pipe 2 is discharged to the outside of the reaction pipe 2 by discharging a gas in the reaction pipe 2 and supplying a predetermined amount of nitrogen into the reaction pipe 2 from the purge gas supply pipe 18 as shown in FIG. 3C (a purge, vacuum process).

Accordingly, one cycle including the adsorbing step and the oxidizing step ends. Next, another cycle starts from the adsorbing step again. Silicon oxide films having desired thicknesses are formed on semiconductor wafers W by repeatedly performing the cycle a predetermined number of times, for example, 100 times.

When the silicon oxide films having the desired thicknesses are formed on the semiconductor wafers W, the semiconductor wafers W are unloaded. In detail, a pressure in the reaction pipe 2 is returned to an atmospheric pressure by supplying a predetermined amount of nitrogen as shown in FIG. 3C into the reaction pipe 2 from the purge gas supply pipe 18, and a temperature in the reaction pipe 2 is maintained at a predetermined temperature, for example, a load temperature, by using the temperature-raising heater 16. The semiconductor wafers W are unloaded by lowering the lid 6 by using the boat elevator 128.

Next, in order to demonstrate the effect of the present embodiment, a film thickness, film thickness uniformity in an in-surface direction, and film thickness uniformity in an inter-surface direction of a silicon oxide film formed by using the method of the present embodiment (when a load temperature is 450° C. which is higher by about 50° C. than a film formation temperature of 400° C.) were measured (an embodiment). In the embodiment, the silicon oxide films were measured at four positions having different distances (boat positions) from a top end of the wafer boat 11. Also, for comparison, a film thickness, film thickness uniformity in an in-surface direction, and film thickness uniformity in an inter-surface direction of a silicon oxide film formed by the same method when a load temperature is 400° C. which is the same as a film formation temperature of 400° C. were measured (a comparative example). Results are shown in FIG. 4.

Figure 4:
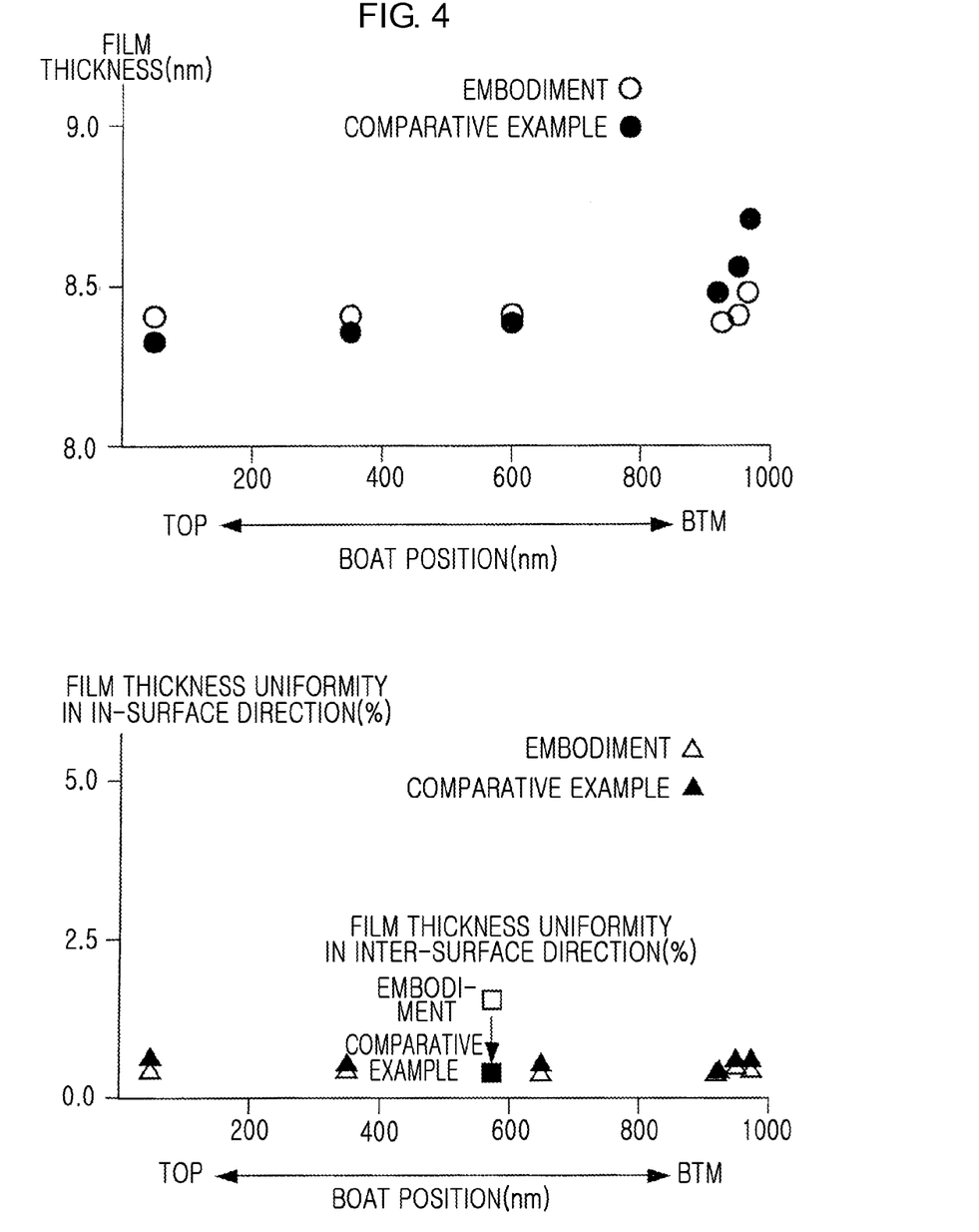
FIG. 4 is graphs showing a relationship among a film thickness, in-surface uniformity, inter-surface uniformity, and a boat position of a silicon oxide film.

As shown in FIG. 4, in the embodiment, the silicon oxide films were formed to have almost uniform film thicknesses at all of the boat positions. In particular, even at the lower portion (the BTM portion) in the reaction pipe 2 where a temperature is easily unstable, the silicon oxide films were formed to have almost the same film thicknesses as those at other portions. Meanwhile, in the comparative example, while the silicon oxide films at an upper portion and a central portion in the reaction pipe 2 were formed to have almost the same film thicknesses as those at other portions, the silicon oxide films at the BTM portion were formed to have film thicknesses different from those at other portions, unlike in the embodiment. Accordingly, the embodiment has better film thickness uniformity in an inter-surface direction than the comparative example. Also, when it comes to film thickness uniformity in an in-surface direction, the embodiment and the comparative example have little difference. As such, it is found that a silicon oxide film having excellent film thickness uniformity in an inter-surface direction is formed at a low temperature by performing the method of forming the silicon oxide film according to the present embodiment.

Also, when the same measurement was performed when a load temperature is higher by 20° C., 40° C., 60° C., or 80° C. than a film formation temperature, silicon oxide films at almost all boat positions were formed to have almost the same film thicknesses and thus film thickness uniformity in an inter-surface direction is excellent.

As described above, according to the present embodiment, since a load temperature is set to a temperature higher than a film formation temperature, a silicon oxide film having excellent film thickness uniformity in an inter-surface direction may be formed at a low temperature.

Also, the present invention is not limited to the above embodiment, and various modifications and changes may be made. Another embodiment to which the present invention may be applied will be explained.

Although a case where silicon oxide films are formed on the semiconductor wafers W has been explained in the above embodiment, a thin film is not limited to the silicon oxide film and any of various thin films such as a silicon nitride film may be formed.

Although a case where DIPAS is used as a Si source gas (e.g., an organic Si source gas) and ozone is used as an oxidizing gas has been explained in the above embodiment, the organic Si source gas is not limited to DIPAS and any of various gases which have a high adsorptive force at a low temperature may be used. When silicon oxide films are formed on the semiconductor wafers W, a monovalent or divalent aminosilane gas may be used as the organic Si source gas.

The oxidizing gas is not limited to ozone, and oxygen or vapor may be used. In this case, since an ozone generating apparatus for generating ozone does not need to be used, a structure of the apparatus may be simplified. Meanwhile, when ozone is used as the oxidizing gas, a film formation temperature may be set to be low.

Although a case where a film formation temperature is 400° C. has been explained in the above embodiment, the film formation temperature is not limited to 400° C., and may range from a room temperature to 600° C. However, there is a preferable temperature range according to a type of a used organic Si source gas. For example, when TDMAS is used as an organic Si source gas, a film formation temperature may be set to range from a room temperature to 550° C., and when BTBAS is used, the film formation temperature may be set to range from a room temperature to 600° C.

Although a case where both a film formation temperature of an adsorbing step and a film formation temperature of an oxidizing step are 400° C. has been explained in the above embodiment, the film formation temperature of the adsorbing step and the film formation temperature of the oxidizing step may be different from each other. In this case, by setting a load temperature to a temperature higher, in particular, by 20° C. to 80° C., than the film formation temperature of the adsorbing step, silicon oxide films having excellent film thickness uniformity in an inter-surface direction may be formed at a low temperature.

Figure 5:
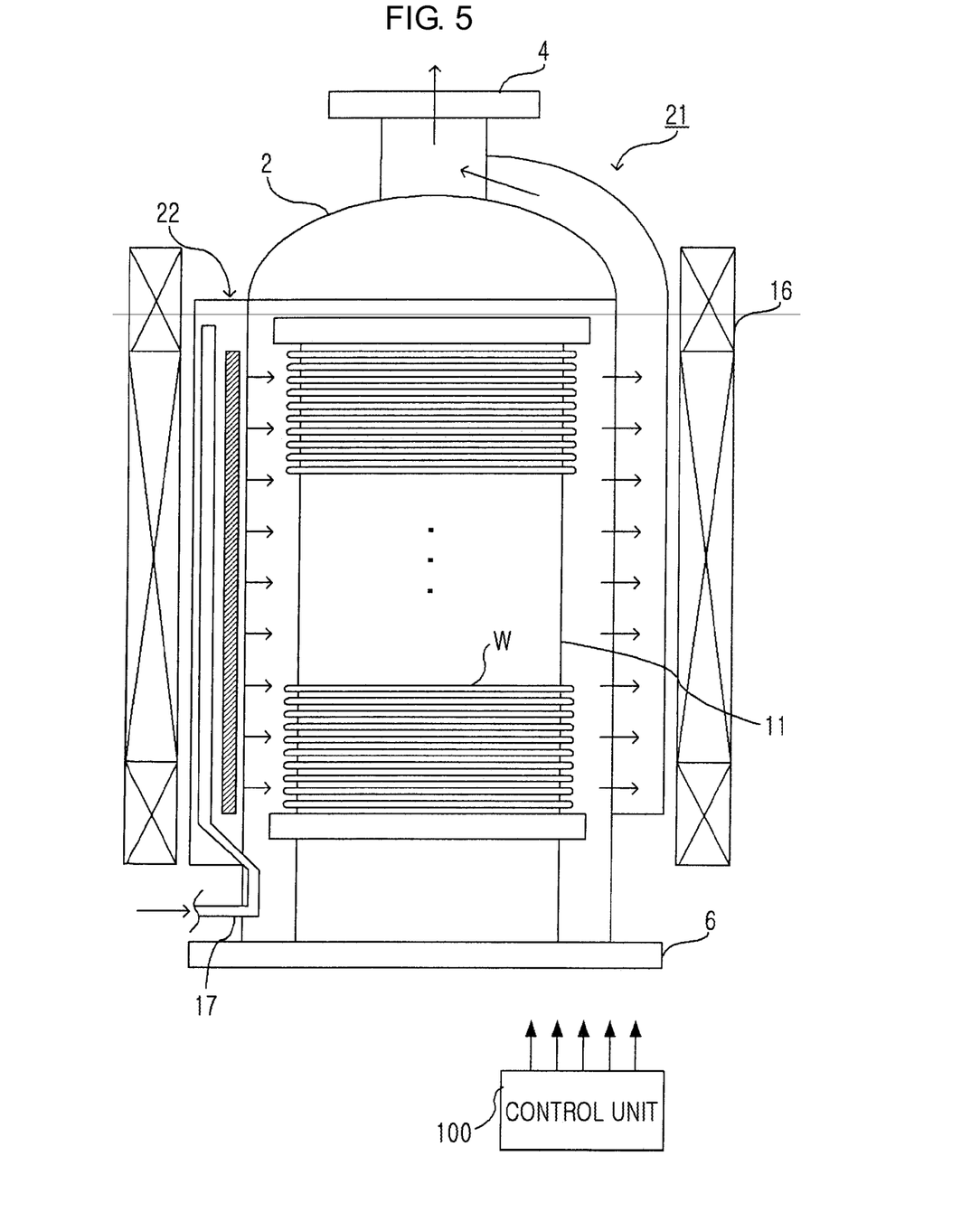
FIG. 5 is a view showing a heat treatment apparatus according to another embodiment of the present invention.

Although a case where a batch type heat treatment apparatus having a single pipe structure is used as a heat treatment apparatus has been explained in the above embodiment, the present invention may be applied to a batch type vertical heat treatment apparatus having a double pipe structure in which the reaction pipe 2 includes an inner pipe and an outer pipe. Also, as shown in FIG. 5, a heat treatment apparatus 21 in which a plasma generator 22 is disposed may be used. In the heat treatment apparatus 21, oxygen or the like is supplied from the process gas introducing pipe 17 to pass through the plasma generator 22, and thus oxygen radicals having oxygen as radicals are generated and are supplied into the reaction pipe 2.

The control unit 100 according to the embodiment of the present invention is not limited to a dedicated system, and may be realized by using a general computer system. For example, the control unit 100 for performing the aforesaid processes may be configured by installing a program in a general-purpose computer from a recording medium (e.g., a flexible disc or a compact disc (CD)-ROM) in which the program for executing the aforesaid processes is stored.

Any unit for supplying the program may be used. The program may be supplied through a predetermined recording medium as described above, or through a communication line, a communication network, a communication system, or the like. In this case, the program may be posted on, for example, a bulletin board system (BBS) of a communication network, may be added to a carrier wave, and may be provided through the network. The aforesaid processes may be performed by starting the provided program under the control of an operating system (OS), like other application programs.

The present invention may be used for forming thin films at a low temperature.

According to the present invention, thin films having excellent film thickness uniformity in an inter-surface direction may be formed at a low temperature.

What is claimed is:

1. A thin film forming method comprising:
    heating a reaction chamber to a load temperature;
    loading an object in the heated reaction chamber; and
    heating the reaction chamber, in which the object is loaded, to a film formation temperature lower than the load temperature, and then forming a thin film on the object by supplying a film forming gas into the reaction chamber.

2. The thin film forming method of claim 1, wherein, in the forming of the thin film, a silicon oxide film is formed on the object.

3. The thin film forming method of claim 2, wherein the forming of the silicon oxide film comprises:
    adsorbing silicon to the object by supplying a silicon source gas into the reaction chamber; and
    forming an oxide film on the object by supplying an oxidizing gas into the reaction chamber and by oxidizing the silicon adsorbed to the object,
    wherein a silicon oxide film is formed on the object by repeatedly performing the adsorbing of the silicon and the forming of the oxide film.

4. The thin film forming method of claim 3, wherein, in the adsorbing of the silicon, the reaction chamber is heated to a first film formation temperature,
    in the forming of the oxide film, the reaction chamber is heated to a second film formation temperature, and
    in the loading of the object in the reaction chamber, the load temperature is set to a temperature higher than the first film formation temperature.

5. The thin film forming method of claim 3, wherein, in the adsorbing of the silicon, a monovalent or divalent aminosilane gas is used as the silicon source gas.

* * * * *